(12) United States Patent
Yang et al.

(10) Patent No.: US 7,911,269 B2
(45) Date of Patent: Mar. 22, 2011

(54) ULTRA LOW NOISE HIGH LINEARITY LNA FOR MULTI-MODE TRANSCEIVER

(75) Inventors: Zixiang Yang, San Diego, CA (US); Chiewcharn Narathong, Laguna Niguel, CA (US); Bo Sun, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 59 days.

(21) Appl. No.: 12/355,860

(22) Filed: Jan. 19, 2009

(65) Prior Publication Data

US 2010/0182090 A1 Jul. 22, 2010

(51) Int. Cl.
*H03F 1/14* (2006.01)
(52) U.S. Cl. .................................... 330/51; 330/124 R
(58) Field of Classification Search .................. 330/51, 330/124 R, 295
See application file for complete search history.

(56) References Cited

U.S. PATENT DOCUMENTS 7,301,396 B1    11/2007    Johnson et al.
7,474,158 B1 *    1/2009    Yim et al. ..................... 330/311

FOREIGN PATENT DOCUMENTS

WO    WO2008115907 A1    9/2008

OTHER PUBLICATIONS

Vladimir Aparin and Lawrence E. Larson, Fellow, Modified Derivative Superposition Method for Linearizing FET Low-Noise Amplifiers, IEEE, pp. 571-580, Feb. 2005.*

Che-Sheng Chen et al: "A 2.5GHz 90nm CMOS Triple Gain Mode LNA for WiMAX Applications" Signals, Systems and Electronics, 2007. ISSSE '07. International Symposium On, IEEE, PI, Jul. 1, 2007, pp. 367-369, XP031129290 ISBN: 978-1-4244-1448-2 p. 367, left-hand column, line 15—p. 368, right-hand column, line 11; figures 2-4.
International Search Report and Written Opinion - PCT/US2009/041041, International Search Authority - European Patent Office - Sep. 15, 2009.
Kumar S. et al: "Enhancement mode PHEMT low noise amplifier with LNA linearity control (IP3) and mitigated bypass switch" Radio Frequency Integrated Circuits (RFIC) Symposium, 2002 IEEE, [Online] Jun. 2, 2002, pp. 213-216, XP007909719 Retrieved from the Internet: URL:http://ieeexplore.ieee.org> [retrieved on Sep. 7, 2009] p. 213, left-hand column, line 20 - p. 215, left-hand column, line 4; figures Ka), kb).
Mujeeb A. et al: "Highly Linear CMOS low noise amplifier with IIP3 boosting technique" SOC Design Conference, 2008. ISOCC '08. International, IEEE, Piscataway, NJ, USA, Nov. 24, 2008, pp. 1-414, XP031449530 ISBN: 978-1-4244-2598-3 p. 414, right-hand column, line 4 - p. 416, right-hand column, line 8, figures 1,2.

* cited by examiner

*Primary Examiner* — Robert Pascal
*Assistant Examiner* — Khiem D Nguyen
(74) *Attorney, Agent, or Firm* — Darren M. Simon

(57) ABSTRACT

An amplifier for operating at low, middle or high linearity modes, the amplifier comprising a first low noise amplifier (LNA) coupled to a second low noise amplifier for providing amplification; a first degeneration inductor coupled to the first LNA for providing impedance matching; a $-g_3$ generation block coupled to an output of the second LNA for canceling third-order transconductance distortion; and a first enabling/disabling component coupled to the output of the second LNA and aligned in parallel with the $-g_3$ generation block for operating at least one of the first and second LNAs at one of the low, middle or high linearity modes.

18 Claims, 15 Drawing Sheets

ULTRA LOW NOISE HIGH LINEARITY LNA FOR MULTI-MODE TRANSCEIVER

FIELD

This disclosure relates generally to amplifiers. More particularly, the disclosure relates to ultra low noise high linearity LNAs.

BACKGROUND

Contemporary multi-mode multi-standard wireless communication systems require high performance radio receivers (a.k.a. receivers). The multi-mode receiver must provide adequate signal-to-noise (SNR) performance for weak signals to achieve maximum sensitivity performance. Additionally, the multi-mode receiver must linearly handle signal and interference levels over a wide dynamic range with minimal distortion. That is, high linearity performance is needed. Distortion is caused by, for example, intermodulation and gain compression. Higher linearity results in reduced intermodulation levels and gain compression. Consequently, low noise, high gain performance is also needed. Typically, receiver design techniques which simultaneously provide both high linearity and low noise are difficult to achieve and subject to design compromises. In addition, many wireless communications devices which are also mobile rely on rechargeable batteries as their energy source, so low dc current consumption is also required to extend battery life.

One important constituent of a high performance receiver is a low noise amplifier (LNA). The LNA is the main determinant of the overall noise performance of the receiver. In other words, the characteristics of the LNA (such as high linearity and low noise) will dominate the overall receiver performance. Generally, the LNA is placed at the front-end of the receiver, near the receive antenna interface, to minimize radio frequency (RF) losses between the antenna and the LNA. The LNA is designed to provide a high gain while contributing a minimal amount of excess noise beyond the noise appearing at the LNA input. This property is known as a low noise figure. To achieve a high linearity characteristic, the LNA should also have a high third-order input intercept point (IIP3). IIP3 is the input level where the third-order intermodulation product levels equal the extrapolated linear desired output level. In general, a high value of IIP3 indicates high linearity performance.

One way to achieve high linearity in a receiver is to incorporate a high performance LNA design which includes a degeneration inductor switching scheme at the LNA input to implement a low linearity (LL) mode, a middle linearity (ML) mode or a high linearity (HL) mode. In one aspect, low linearity corresponds to low noise. The addition of degeneration inductors in the LNA design improves device input/output impedance matching, noise matching, stability and linearity but with reduced gain. However, in the high frequency especially 2 GHz and above frequency range (including International Mobile Telecommunications (IMT) and higher frequency bands), the LNA designs with switching degeneration inductor schemes have degraded noise performance (i.e., increased noise figure) compared to their performance at lower frequencies.

Typical receivers also incorporate a downconverter mixer after the LNA to convert the receiver radio frequency (RF) band to an intermediate frequency (IF) band. Downconversion is performed because subsequent signal processing, such as, gain control, bandpass filtering, etc., is more conveniently employed in the IF band. In some receivers, a bandpass filter is included prior to the downconverter mixer to eliminate undesired products (such as transmit-to-receive noise leakage) from the frequency downconversion. One example of a bandpass filter used in receiver designs is a surface acoustic wave (SAW) filter. However, the bandpass filter adds insertion loss and mass to the receiver design. Thus, the vulnerability of the receiver to undesired products such as transmit-to-receive noise leakage is mitigated by the addition of a bandpass filter at the expense of added insertion loss and mass, which requires better noise performance on the LNA to compensate for the worse SNR caused by the additional insertion loss.

SUMMARY

Disclosed is an apparatus and method for achieving ultra low noise and high linearity in a receiver design, particularly suited for high frequency (2 GHz and above) range. One skilled in the art would understand that the features associated with a receiver design can be implemented into the receiving components of a transceiver without affecting the scope and spirit of the present disclosure. According to one aspect, an amplifier for operating at low, middle or high linearity modes, the amplifier comprising a first low noise amplifier (LNA) coupled to a second low noise amplifier for providing amplification; a first degeneration inductor coupled to the first LNA for providing impedance matching; a $-g_3$ generation block coupled to an output of the second LNA for canceling third-order transconductance distortion; and a first enabling/disabling component coupled to the output of the second LNA and aligned in parallel with the $-g_3$ generation block for operating at least one of the first and second LNAs at one of the low, middle or high linearity modes.

According to another aspect, an amplifier for operating at low linearity, middle linearity or high linearity modes, the amplifier comprising an RF input port; a first low noise amplifier (LNA) and a second low noise amplifier both coupled to the RF input port for providing amplification; a first degeneration inductor coupled to the first LNA and the second LNA for providing impedance matching; a $-g_3$ generation block coupled to an output of the second LNA for canceling third-order transconductance distortion; a first switch coupled to the output of the second LNA and aligned in parallel with the $-g_3$ generation block; and a second switch aligned in parallel with the $-g_3$ generation block while coupled to the second LNA at a first end and to a ground at a second end and wherein either a) the first switch is closed to operate the first and second LNAs in the low linearity mode or b) the first switch is open and the second switch is closed to operate the first and second LNAs in the high linearity mode.

Advantages of the present disclosure include achieving ultra low noise and high linearity performance while eliminating the insertion loss and mass associated with a bandpass filter (e.g., SAW filter) associated with the downconverter in a receiver design. The LNA designs of the present disclosure allow the use of dual LNAs for low, middle and high linearity modes, resulting in achieving the best performance in all three modes.

It is understood that other aspects will become readily apparent to those skilled in the art from the following detailed description, wherein it is shown and described various aspects by way of illustration. The drawings and detailed description are to be regarded as illustrative in nature and not as restrictive.

BRIEF DESCRIPTION OF THE DRAWINGS

FIG. 9 illustrates example input matching performance data for the dual LNA architecture illustrated in FIG. 7a.

DETAILED DESCRIPTION

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for the purpose of providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 1:
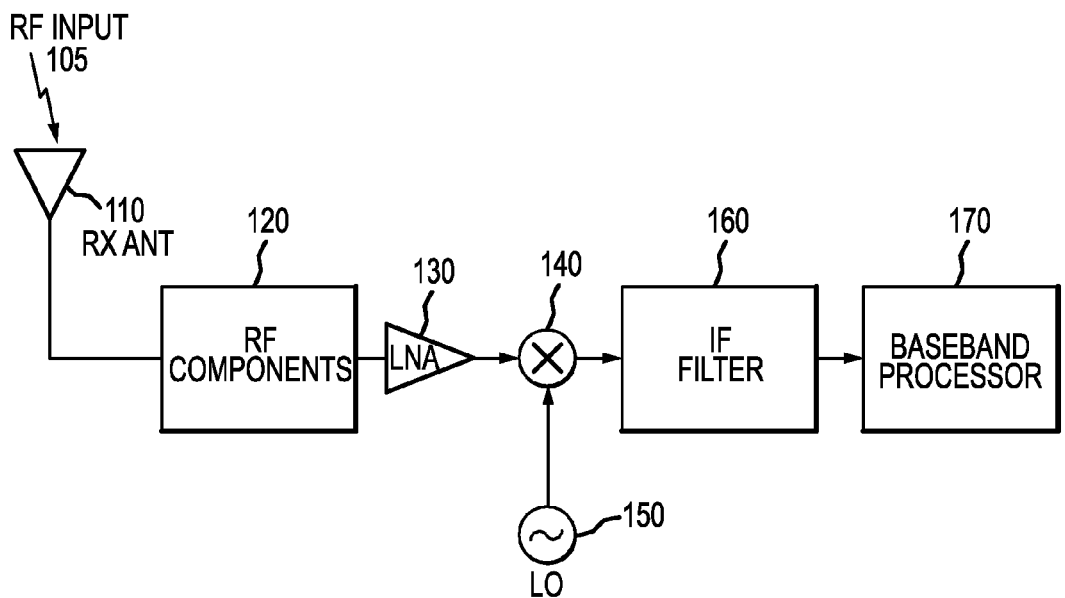
FIG. 1 illustrates an example block diagram of a receiver 100.

FIG. 1 illustrates an example block diagram of a receiver 100. As shown in FIG. 1, an RF input 105 is received by a receive antenna 110. One skilled in the art would understand that many skilled in the art refer to a receiver without the receive antenna, while others skilled in the art refer to a receiver to include the receive antenna. The reference to receiver 100 with or without the receive antenna 110 does not affect the scope and spirit of the present disclosure. Various RF components, such as an isolator, switch, etc., are included in block 120. One skilled in the art would understand that the choice of the RF components included in the receiver may be based on desired overall receiver performance. Next, a low noise amplifier (LNA) 130 is provided to amplify the RF input with high gain and low additional noise. The RF output of the LNA is inputted into a downconverter mixer 140 which frequency converts the RF output from the RF band to a desired IF band. Frequency conversion is facilitated by the frequency setting of a local oscillator (LO) 150. In one example, the LO includes a frequency synthesizer (not shown) which allows a variety of frequency settings to be used in the frequency downconversion. The output of the downconverter mixer is inputted to an IF filter 160 to set the signal passband and to reject undesired mixer products. The output of the IF filter is then inputted to a baseband processor 170 for subsequent signal processing. In one example, the baseband processor includes in-phase/quadrature (I/Q) detection, demodulation, analog-digital (A/D) conversion, etc. One skilled in the art would understand that the components of the receiver 100 as shown in FIG. 1 are not exclusive. Other components may be added or some of the components shown in FIG. 1 may not be included depending on the desired overall receiver performance without affecting the scope and spirit of the present disclosure. Additionally, the sequence of the components of the receiver 100, as shown in FIG. 1, may vary according to the desired overall receiver performance.

The linearity characteristic of the receiver shown in FIG. 1 is dominated by the LNA 130. In one example, the LNA 130 includes at least one field effect transistor (FET) to provide the low noise amplification. The field effect transistors (FET) within the LNA 130 are nonlinear devices. When the FETs are operated in their nonlinear regions, they generate various output distortion components. In particular, the FET that dominates the generation of output distortion components is referred to as the main FET. If the main FET is biased at the saturation region, a simple mathematical model of the small-signal drain-to-source current $i_{DS}$ is a Taylor series expansion, up to third order, of the gate-to-source voltage $V_{GS}$ as shown in equation (1):

$$i_{DS} = g_1 V_{GS} + g_2 V_{GS}^2 + g_3 V_{GS}^3 \qquad (1)$$

where $g_1$ is the small-signal linear transconductance coefficient, and $g_2$ and $g_3$ are the second-order and third-order, respectively, transconductance distortion components. In particular, the third-order intermodulation distortion (IMD3) and third order input intercept point (IIP3) are determined by the third order transconductance distortion component $g_3$. Some sort of cancellation scheme can be used to minimize g3, but unfortunately, such cancellation (a.k.a −g3 generator) usually generate negative g1 at the same time, thus degrade gain and noise figure. IIP3 is a figure of merit for characterizing the degree of nonlinearity in an amplifier, where a highly linear amplifier has a high value for IIP3. In one example, the amplitude of IIP3 is expressed in equation (2) as:

$$\text{IIP3} = \sqrt{(4/3)|g_1/g_3|} \qquad (2)$$

In practice, both low linearity (LL) and high linearity (HL) are desired in the same system but it is allowable to switch between LL (i.e., high sensitivity low noise mode) and HL (i.e., lower sensitivity but higher dynamic range mode). Normally, because IIP3 must be met and noise degradation from the distortion cancellation circuit is tolerable especially at low frequency range, the noise figure (NF) is chosen to be compromised to achieve high linearity. But, as the operation frequency goes higher, the noise effect is more significant and no longer tolerable. The tradeoff between noise and linearity performance is more difficult. The degradation of noise figure may not be optimal from the system perspective.

Figure 2:
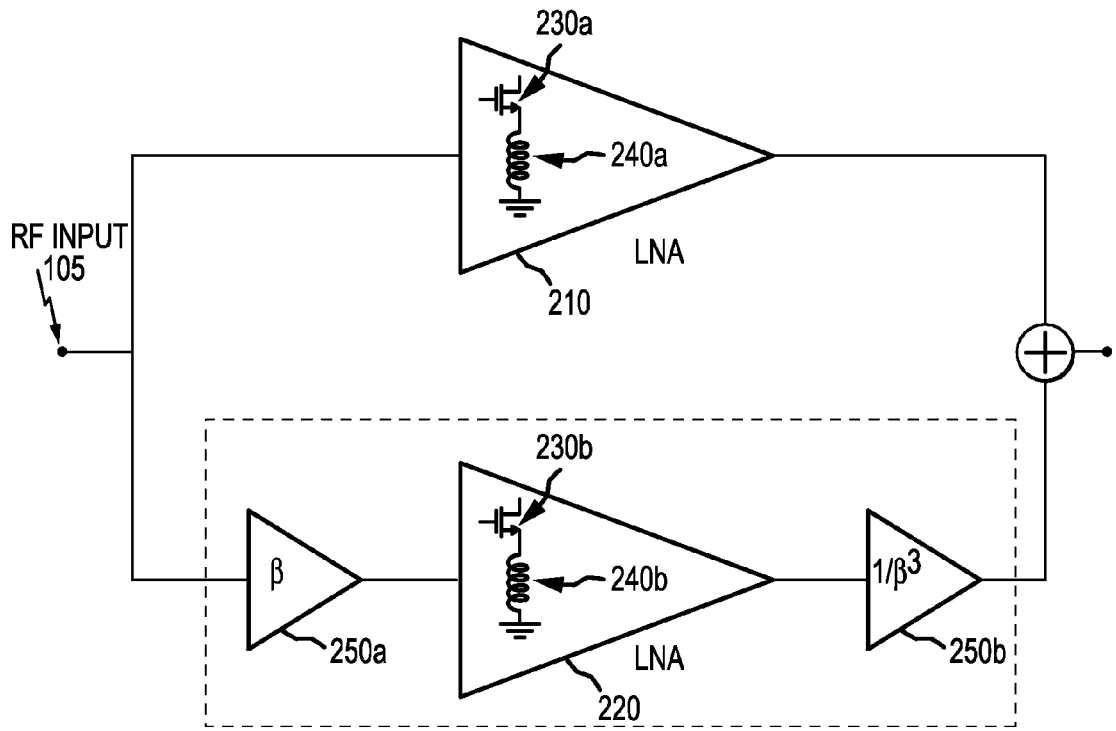
FIG. 2 illustrates the concept of a prior art of LNA design for use, for example in a receiver, to achieve high linearity characteristics.

FIG. 2 illustrates an example of a prior art of LNA design for use, for example in a receiver, to achieve high linearity characteristics. As illustrated in FIG. 2, two LNAs 210 and 220 are in parallel. Each of the two LNAs 210, 220 includes a FET 230a, 230b and a degeneration inductor 240a, 240b. Two LNA paths for the RF input 105, one from LNA 210 and the other from LNA 220, are shown in FIG. 2. The LNA path associated with LNA 220 also includes a gain block β 250a before LNA 220 and an attenuation block $1/\beta^3$ 250b after the LNA 220. The LNA path associated with LNA 220 is the feed forward path used for cancelling the third-order transconductance distortion component $g_3$ generated by the nonlinearity in LNA 210 and for achieving higher linearity. The example of the prior art LNA design as shown in FIG. 2 is illustrated in Yongwang Ding et al., "A +18 dBm IIP3 LNA in 0.35 um CMOS" 2001 IEEE International Solid State Circuits Conference (ISSCC 2001), Session 10/Wireless Building Blocks I/10.5. There are difficulties in implementing such architecture in mass production including the extra noise degradation from the feedforward path, the match between two paths over PVT (process, voltage, temperature) and the match between β 250a and $1/\beta^3$ 250b over PVT.

Figure 3:
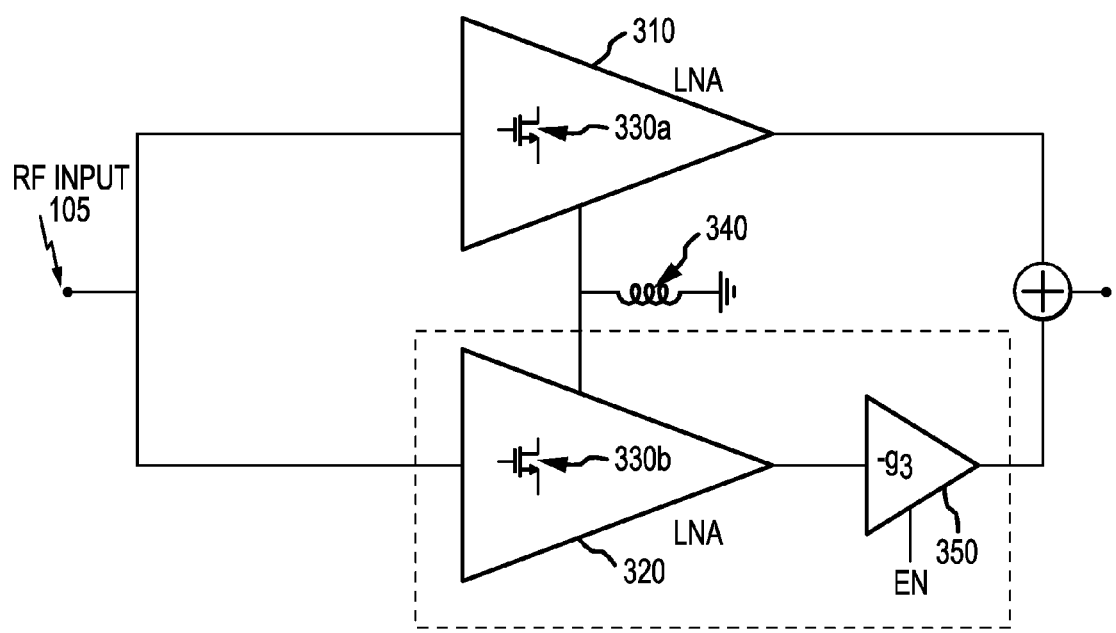
FIG. 3 illustrates an example of a single ended dual LNA architecture for use, for example in a receiver, to achieve both low noise and high linearity characteristics.

FIG. 3 illustrates an example of a single ended dual LNA architecture for use, for example in a receiver, to achieve low noise and high linearity characteristics. In the example illustrated in FIG. 3, only the LNA path with g3 cancellation generator is enabled for high linearity mode. In this FIG. 3 example, the third-order transconductance distortion component $g_3$ cancellation is performed after low noise amplification. As illustrated in FIG. 3, two LNAs 310 and 320 are in parallel providing two LNA paths for the RF input 105, one from LNA 310 and the other from LNA 320. LNA 310 includes a FET 330a, and LNA 320 includes a FET 330b as illustrated in FIG. 3. A single degeneration inductor 340 is shared between the two LNAs 310, 320 resulting in silicon area saving. Sharing the degeneration inductor is not always feasible in the architecture shown in FIG. 2 because LNAs 210 and 220 require different inductor values. The sharing of the single degeneration inductor 340 facilitates better impedance matching than can be obtained with two separate inductors, each within an LNA as shown in FIG. 2.

In FIG. 3, the third-order transconductance distortion component $g_3$ cancellation is done by the $-g_3$ generator block 350 whose input could be tapped off various nodes within LNA 320. In this particular drawing, the input of $-g3$ generator is tapped off output of LNA 320. In one aspect, implementing the $-g_3$ generator block 350 after the LNA 320 has the advantage of less loading at the LNA inputs which results in better noise performance. The $-g_3$ generator block 350 includes an enable line (denoted by EN) for enabling or disabling the $-g_3$ generator block 350. In the LNA architecture illustrated in FIG. 3, both LNAs 310, 320 are used in the high linearity (HL) mode. The LNA 320 and $-g3$ generator block 350 combination will compensate LNA 310's linearity characteristic to result in a higher combined linearity characteristic. In one aspect, only LNA 310 is used for the low linearity (LL) mode (a.k.a. high sensitivity mode). Although LNA 320 is turned off for the low linearity mode, it is still loading the RF input and degrades noise figure, therefore it has high minimum achievable noise figure. In addition, turning on and off LNA 320 changes the input matching which also affects RF performance.

Figure 3A:
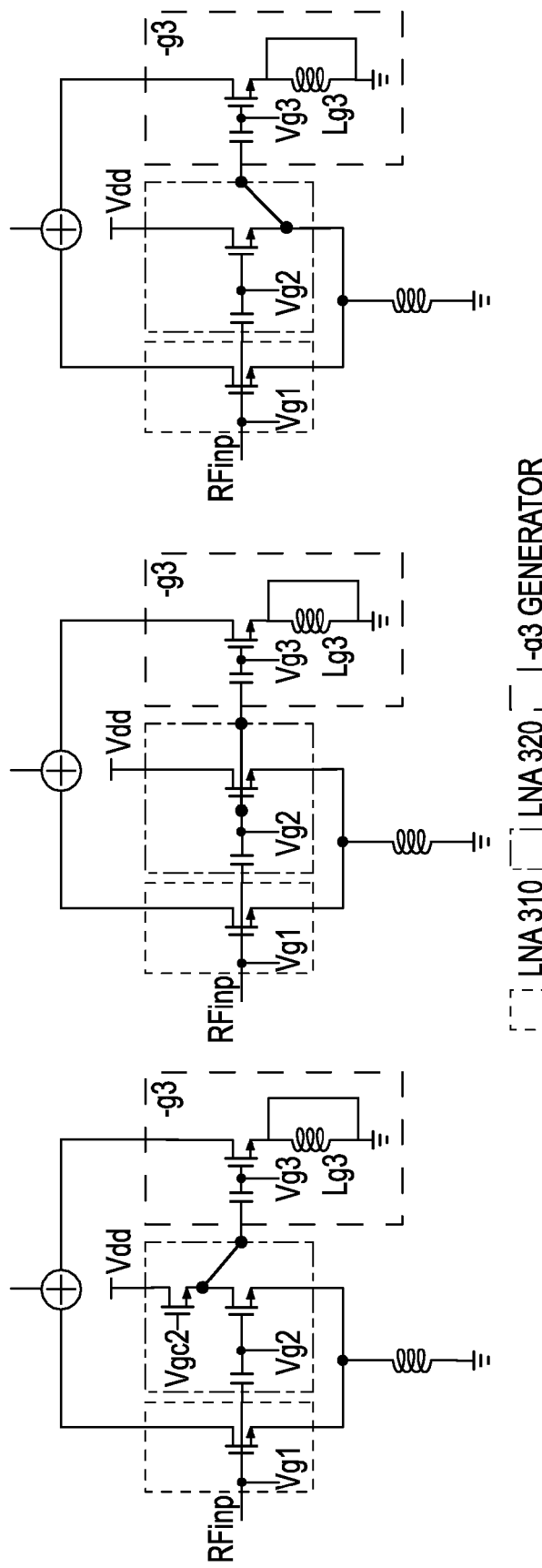
FIG. 3a illustrates three implementation examples of the single ended dual LNA architecture in FIG. 3.

FIG. 3a illustrates three implementation examples of the single ended dual LNA architecture in FIG. 3. Although the examples are shown in single-ended amplifiers, each example can be converted to differential amplifiers through techniques well known to one skilled in the art. Note these examples are illustrative in nature and not as restrictive. For example, one skilled in the art may add cascade devices for the benefit of better matching. In FIG. 3a, the enable of LNA1 (LNA310 in FIG. 3) can be done with Vg1. The enable of LNA2 (LNA320 in FIG. 3) can be done with Vg2 or Vgc2. The enable of $-g3$ generator can be done with Vg3. The input of the $-g3$ generator can be tied to various nodes of LNA2, as shown in various examples in FIG. 3a.

Figure 4:
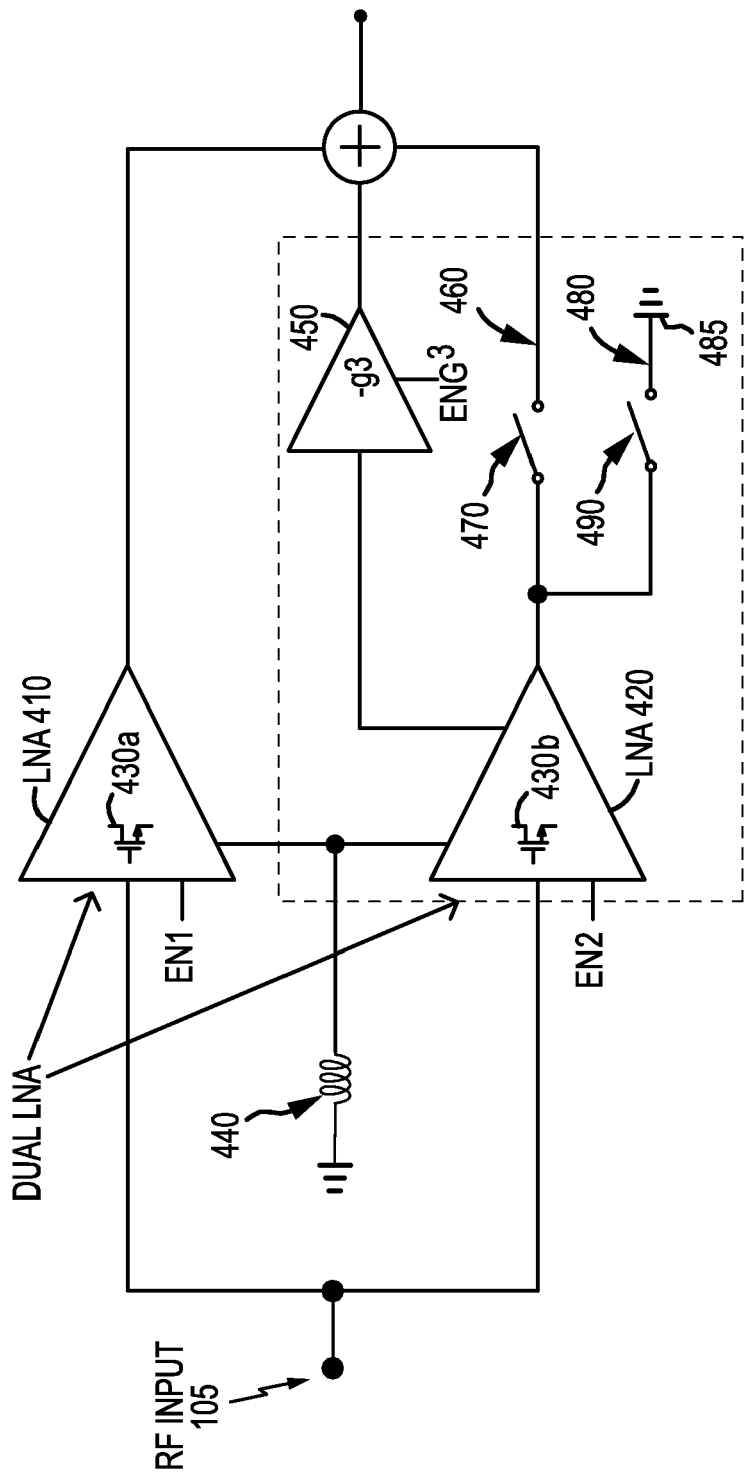
FIG. 4 illustrates an example of an improved single ended dual LNA architecture for use, for example in a receiver, to achieve low linearity, middle linearity or high linearity characteristics.

FIG. 4 illustrates an example of an improved single ended dual LNA architecture for use, for example in a receiver, to achieve low linearity, middle linearity or high linearity characteristics. In one aspect, low linearity corresponds to low noise. In one example, FIG. 4 illustrates an amplifier. As illustrated in FIG. 4, two LNAs 410 and 420 are in parallel providing two LNA paths for the RF input 105 (a.k.a. RF input port), one from LNA 410 and the other from LNA 420. The RF input 105 receives input signals to the LNA architecture. LNA 410 includes a FET 430a, and LNA 420 includes a FET 430b as illustrated in FIG. 4. A single degeneration inductor 440 is shared between the two LNAs 410, 420. In one aspect, the sharing of the single degeneration inductor 440 saves silicon area and facilitates better impedance matching than can be obtained with two separate inductors, each within an LNA as shown in FIG. 2. However, one skilled in the art would understand that having two degeneration inductors does not affect the scope and spirit of the present disclosure.

In one aspect, LNA 410 is used for the low linearity (LL) mode (a.k.a. high sensitivity mode). If LNA 410 is used for the low linearity mode, the noise figure of LNA 410 is dominant for the low linearity mode performance. However, also illustrated in FIG. 4 is path 460 which is connected to LNA 420 and can also be used for the low linearity mode with intelligent switching. Path 460 is shown with a switch 470. The switch 470 can be easily realized by a cascade device following LNA 420. The switch 470 is located after the LNA therefore it has minimum effect on the system performance. In one example, the function of switch 470 is performed by an enabling/disabling component. In one aspect, the enabling/disabling component (or the switch 470) is controlled by a processor for enabling or disabling (i.e., opening or closing the switch). Control by the processor allows for intelligent switching, i.e., decisions for enabling or disabling is based on predetermined parameters and/or analysis performed by the processor. When switch 470 is open, path 460 is disabled. When switch 470 is closed, path 460 is enabled. Although a switch 470 is illustrated in FIG. 4, one skilled in the art would understand that many other well known components and techniques for enabling or disabling an electrical path can be used without affecting the scope and spirit of the present disclosure.

As illustrated in FIG. 4, with path 460 enabled, both LNA 410 and LNA 420 can provide gain (g1 in equation 1) during low linearity mode. Compare to LNA 320 in FIG. 3, LNA 420 is no longer only a loading effect in LL (low linearity) mode any more, it is providing useful gain to the system and helping the noise performance significantly particularly for the high frequency range. In fact, with such configuration, in LL mode, LNA 410 and LNA 420 could be viewed as a simple inductor degenerated LNA with no extra loading at the RF input, therefore it has lowest possible noise figure. One benefit of using dual LNAs in low linearity mode is achieving a much lower noise figure without increasing LNA current consumption. With a lower noise figure, one corollary benefit is to relax the transmit-to-receive noise leakage requirement. Additionally, a stable input impedance match (S11 parameter) is maintained regardless of linearity modes. In most communication systems, operation in low linearity mode dominates, enhancing the importance of using the dual LNAs in the low linearity mode to obtain a lower noise figure without increasing LNA current consumption.

Also illustrated as an example in FIG. 4 is a second switch (switch 490) in path 480. As shown, switch 490 is connected to LNA 420 and AC ground (power supply or ground supply). If switch 470 is open and switch 490 is closed, both LNA 410 and LNA 420 are used for high linearity mode. The third-order transconductance distortion component $g_3$ cancellation is performed by the $-g_3$ generator block 450 whose input can be tapped off from various nodes of LNA 420. The output of the $-g_3$ generator block 450 is used to cancel third-order transconductance distortion components, i.e., the nonlinear distortion output of the LNA 410. The cancellation methods that can be adopted in block 450 include, but are not limited, to Modified Distortion Superposition (MDS) and Post Linearization techniques. One write-up of the Modified Derivative Superposition technique is found in V. Aparin and L. E. Larson, "Modified derivative superposition method for linearizing FET low-noise amplifiers," IEEE Trans. Microwave Theory and Tech., vol. 53, no. 2, February 2005, pp. 571-581. And, one write-up of the Post Linearization technique is found in N. Kim et al, "A Cellular-Band CDMA 0.25 um CMOS LNA Linearized Using Active Post-Postdistortion," IEEE JSSC, vol. 41, no. 7, July 2006, pp. 1530-1534. Various linearization techniques are well known to those skilled in the art and are not discussed in details in this disclosure.

The $-g_3$ generator block 450 includes an enable line (denoted by $ENg^3$) for enabling or disabling the $-g_3$ generator block 450. In one aspect, LNA 410 operates in conjunction with LNA 420 and the $-g_3$ generation block 450 to provide the high linearity mode.

In one example, an RF input port 105 is coupled to a first LNA input and a second LNA input as illustrated in FIG. 4. In one example, LNA 410 includes an enable line denoted by EN1 for enabling or disabling, and LNA 420 includes an enable line denoted by EN2 for enabling or disabling. More linearity/noise modes can be realized by intelligently configuring the enable lines and switches shown in FIG. 4. For example, a middle linearity (ML) mode can be realized by configuring the dual LNA architecture shown in FIG. 4 in the following way: turn on EN1, EN2, $ENg^3$, close switch 470, open switch 490. In such operation, the nonlinearity distortion at the output of $-g3$ generator block is enough to cancel the distortion from LNA 410 but the distortion from LNA 420 is not cancelled. Therefore, in ML mode, the linearity performance is worse than HL mode, but better than LL mode. At the same time, the noise performance of ML mode is better than HL mode, while worse than LL mode. More linearity/noise modes facilitate the trade off on system level performance. It increases the intelligence capabilities of the communication system.

The LNA design illustrated in FIG. 2 achieves high linearity performance but is not as well suited when a low noise characteristic is desired. The LNA design illustrated in FIG. 3 combines two LNAs, LNA 310 which is better suited for low noise performance and LNA 320 which is better suited for high linearity performance. The LNA designs illustrated in FIG. 4 includes the added paths and switches which allow for intelligent switching between the two LNAs. Thus, the LNA designs in FIG. 4 allow for the use of both LNAs for low noise mode and high linearity mode, resulting in achieving the best performance in both LL and HL modes.

Figure 4A:
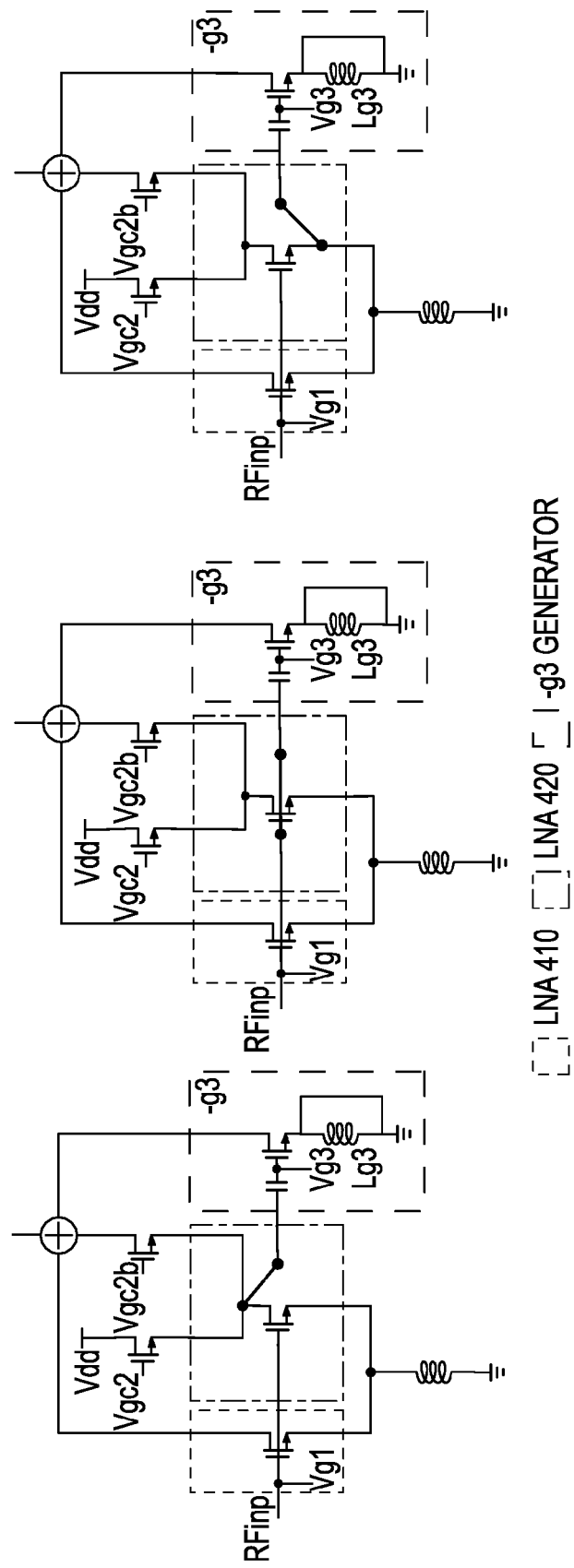
FIGS. 4a and 4b illustrate various implementation examples of the improved single ended dual LNA architecture in FIG. 4.
Figure 4B:
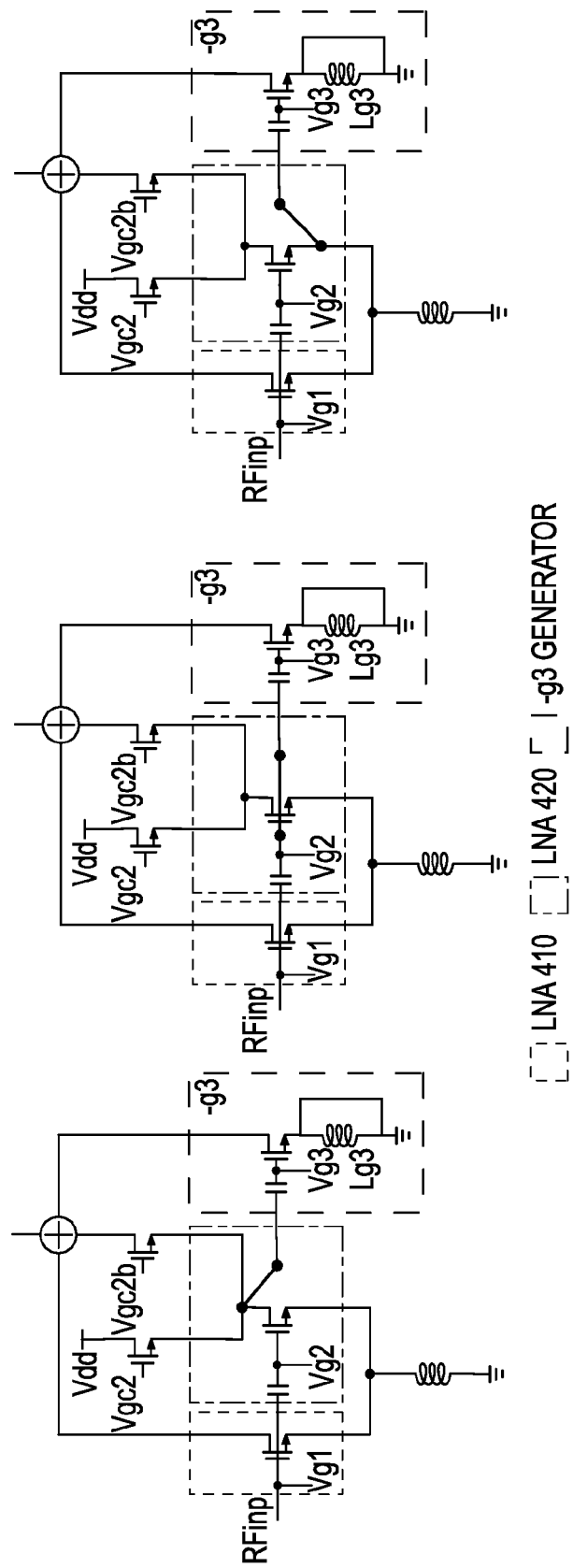

FIGS. 4a and 4b illustrate various implementation examples of the improved single ended dual LNA architecture in FIG. 4. Although the examples are shown in single-ended amplifiers, each example can be converted to differential amplifiers through techniques well known to one skilled in the art. One skilled in the art would understand that these examples are illustrative in nature and are not to be construed as restrictive. In FIG. 4a, LNA410 and LNA420 can be enabled/disabled with Vg1. And, the $-g3$ generator block can be enabled/disable with Vg3. The input of the $-g3$ generator block can be tied to various nodes of LNA 420. The control of switch 470 and switch 490 shown in FIG. 4 are realized by Vgc2b and Vgc2 respectively.

In FIG. 4b, LNA 420 is enabled/disabled by Vg2. LNA 410 is enabled/disabled by Vg1 which is separate from Vg2. The examples in FIG. 4b add flexibility, but at the cost of extra loading to the RF input, thus degrading noise performance.

FIG. 5a-8b illustrate various differential architectural variants of the dual LNA architecture shown in FIG. 4. The differential architectural variants shown in FIGS. 5a-8b are optimized to provide stable input matching, superb low linearity noise performance for high frequency operation, and no compromising in linearity. As stated, one skilled in the art would understand that the quantity of degeneration inductors, whether one or two, in the dual LNA architecture does not affect the scope and spirit of the present disclosure.

Figure 5A:
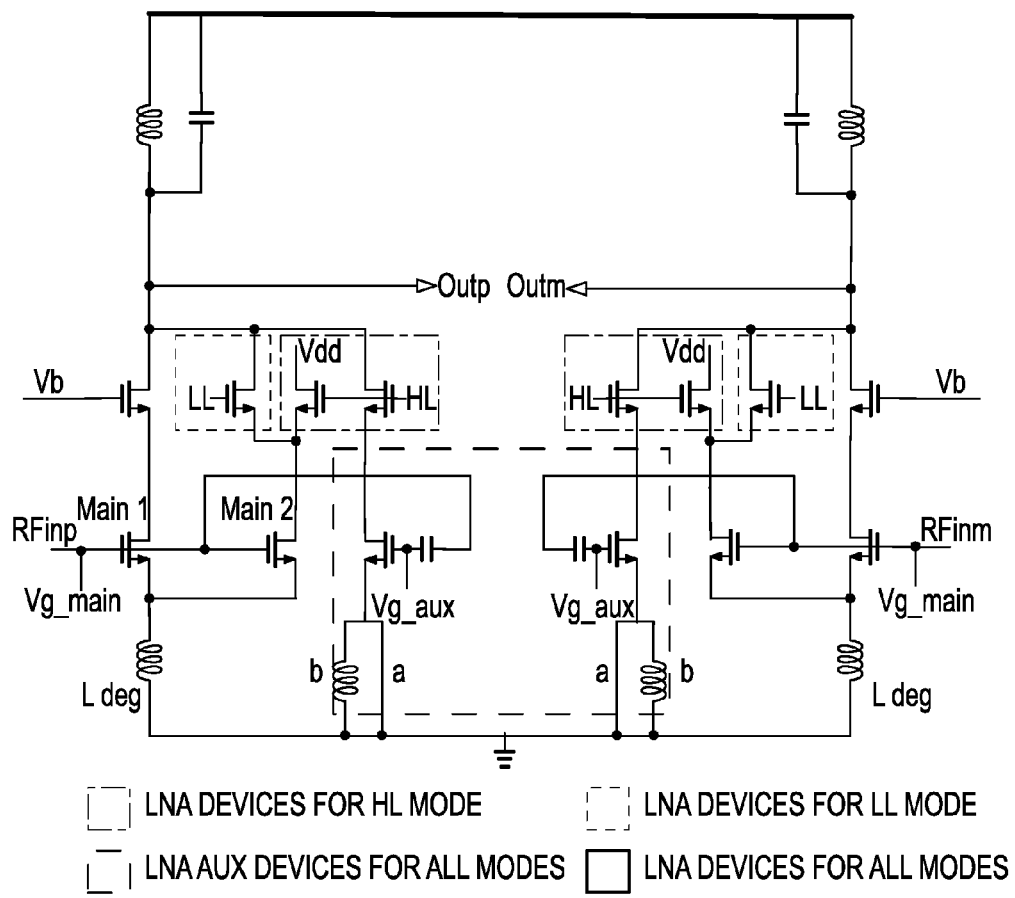
FIGS. 5a-8b illustrate various differential architectural variants of the improved single ended dual LNA architecture shown in FIG. 4.
Figure 5B:
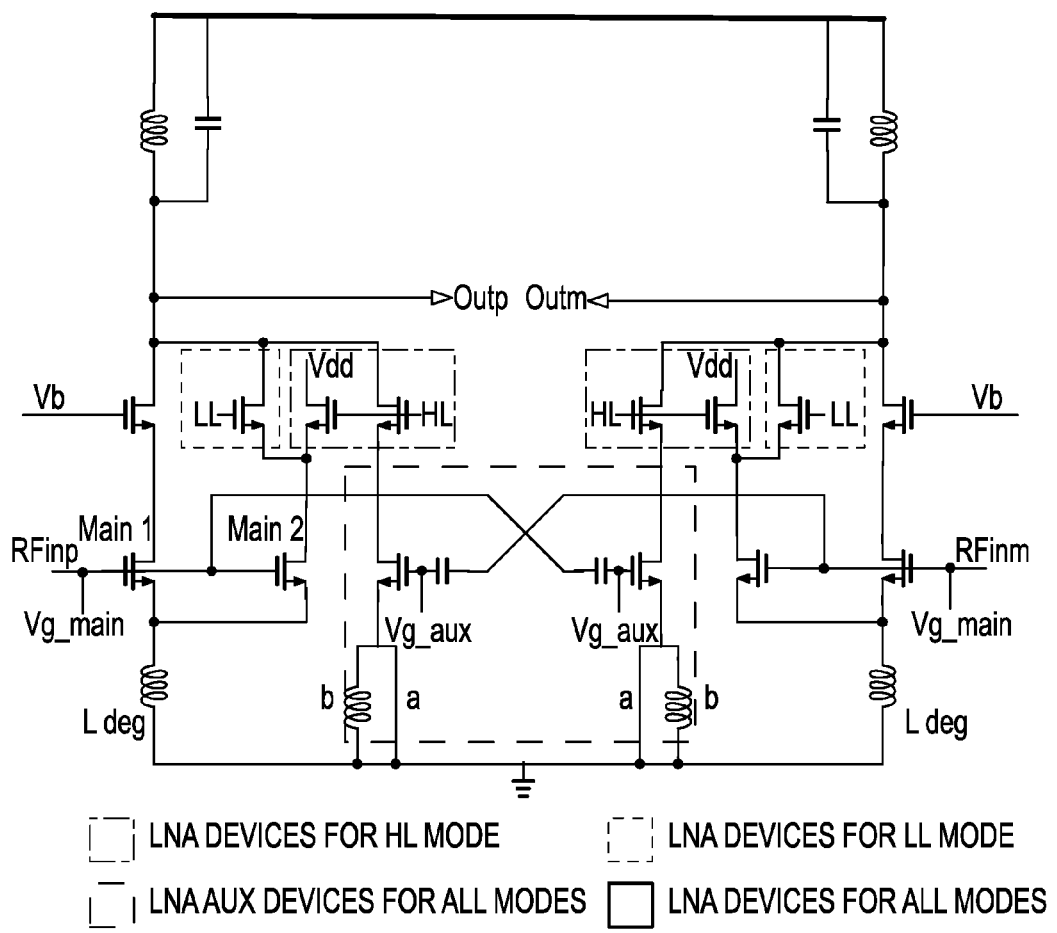

FIGS. 5a and 5b illustrate a first set of examples of differential architectural variant of the dual LNA architecture shown in FIG. 4. The input of the $-g3$ generator (auxiliary path) is tied to the input of the LNA 420 (gate of Main2 device) in either its own half plane (as shown in FIG. 5a) or the other half plane (as shown in FIG. 5b). The degeneration inductor can be either adopted or omitted in the auxiliary path depending on the performance requirement. The output of the auxiliary path is combined with the output of the LNA 410 after the cascode portion of the amplifier.

Figure 6A:
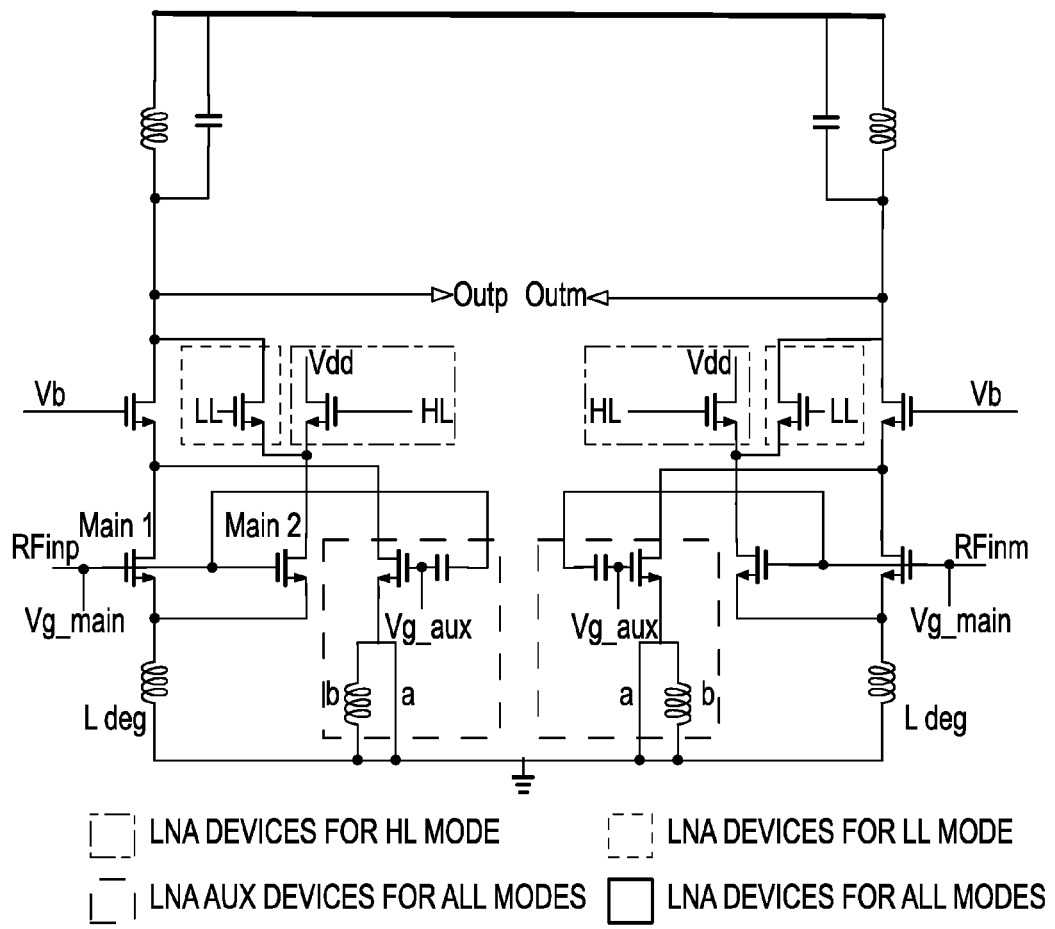
Figure 6B:
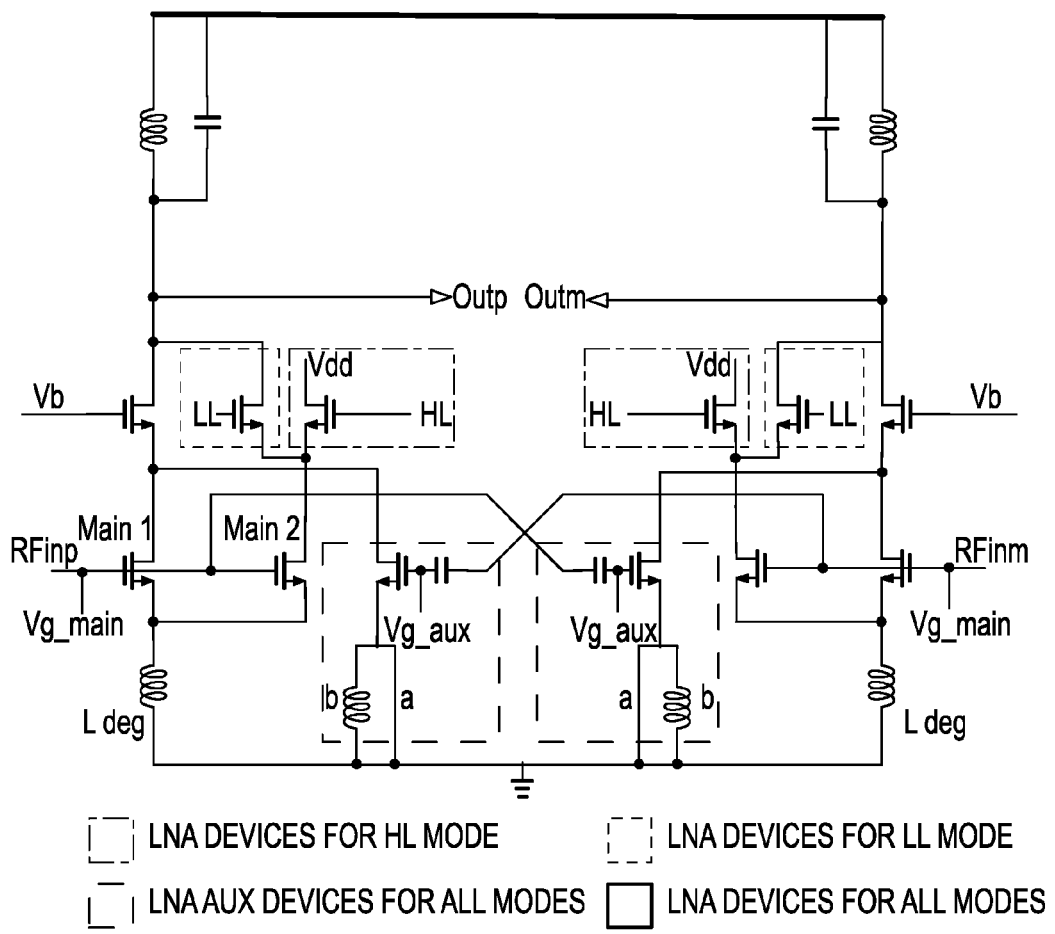

FIGS. 6a and 6b illustrate a second set of examples of differential architectural variant of the dual LNA architecture shown in FIG. 4. The input of the $-g3$ generator (auxiliary path) is tied to the output of the LNA 420 (drain of Main2 device) in either its own half plane (as shown in FIG. 6a) or the other half plane (as shown in FIG. 6b). The degeneration inductor can be either adopted or omitted in the auxiliary path depending on the performance requirement. The output of the auxiliary path is combined with the output of the LNA 410 before the cascode portion of the amplifier.

Figure 7A:
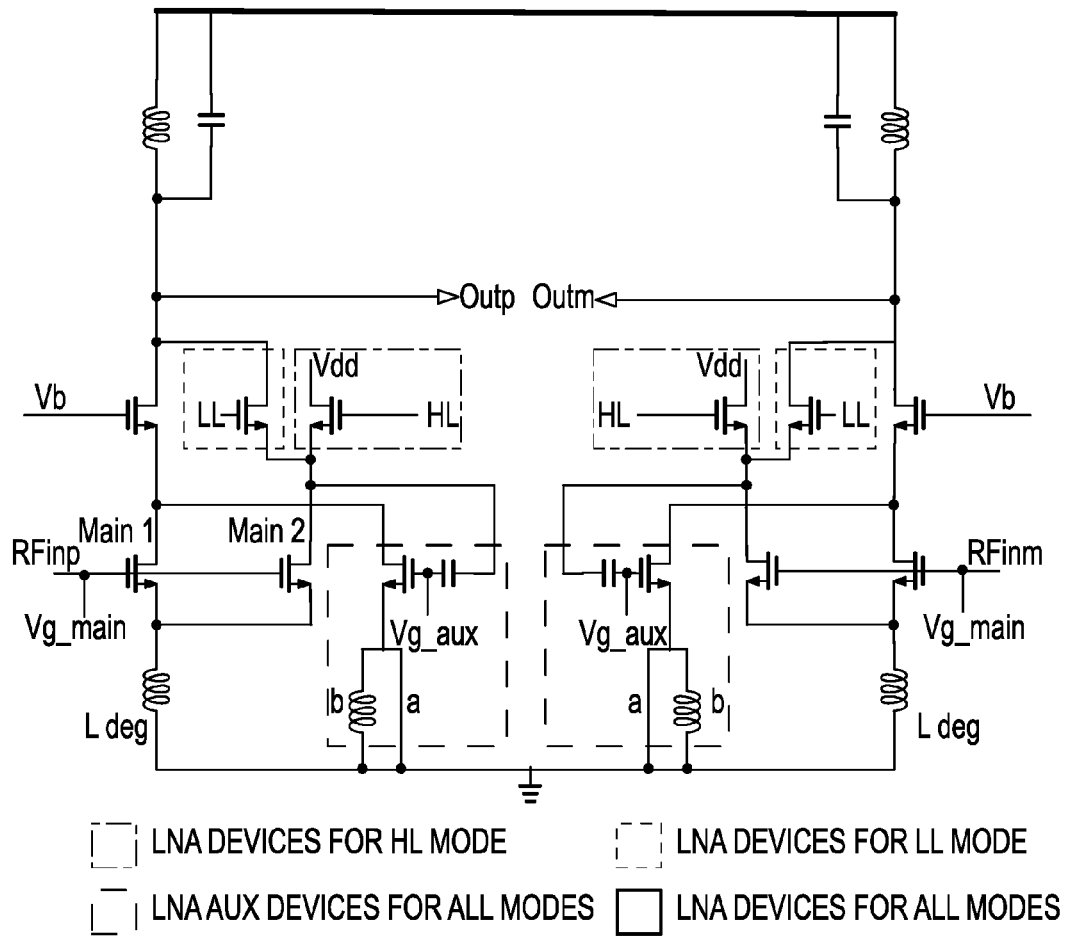
Figure 7B:
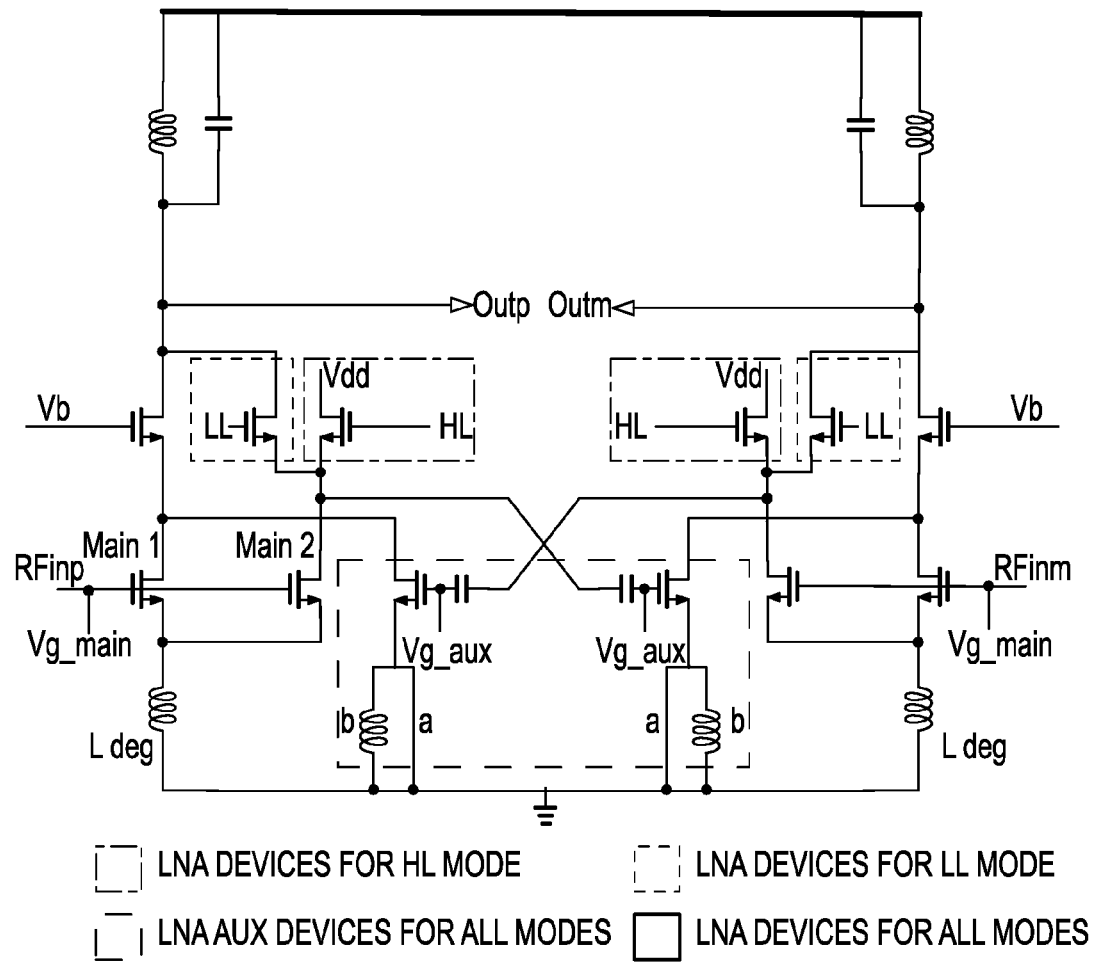

FIGS. 7a and 7b illustrate a third set of examples of differential architectural variant of the dual LNA architecture shown in FIG. 4. The input of the $-g3$ generator (auxiliary path) is tied to the output of the LNA 420 (drain of Main2 device) in either its own half plane (as shown in FIG. 7a) or the other half plane (as shown in FIG. 7b). The degeneration inductor can be either adopted or omitted in the auxiliary path depending on the performance requirement. The output of the auxiliary path is combined with the output of the LNA 410 before the cascode portion of the amplifier.

Figure 8A:
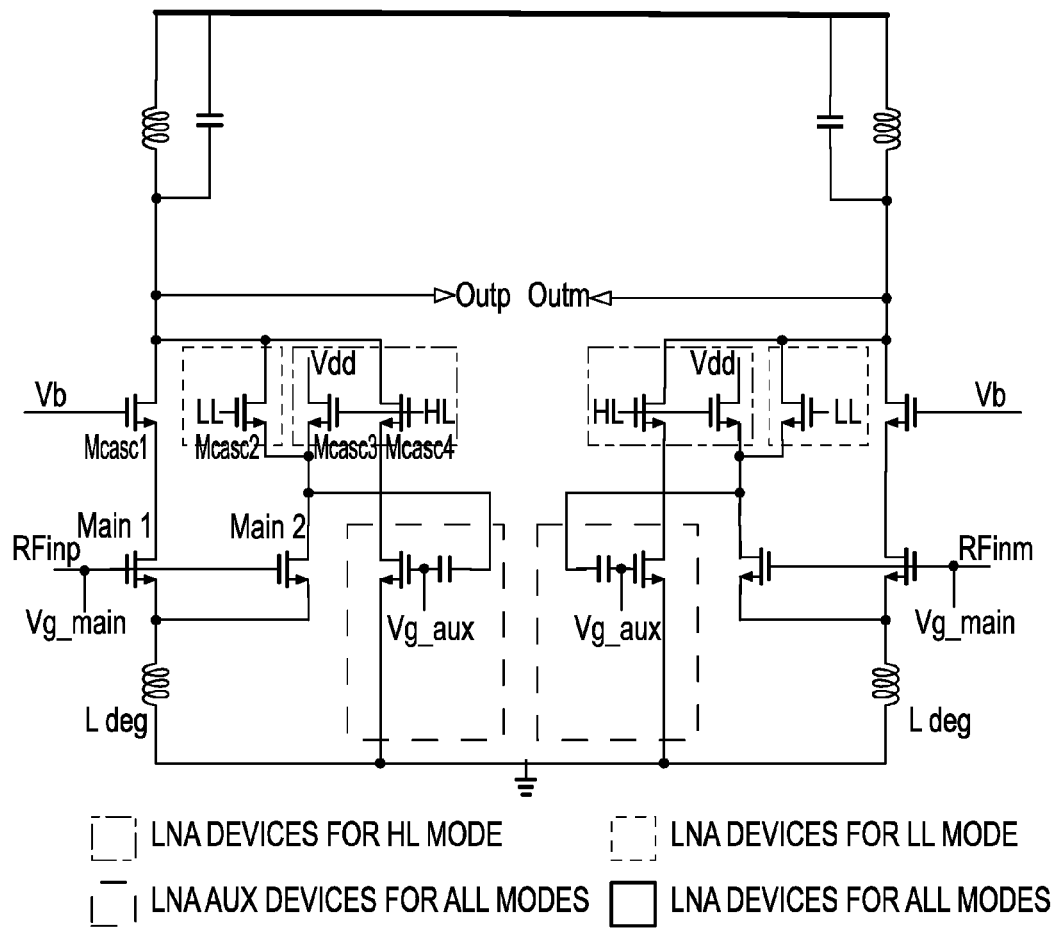
Figure 8B:
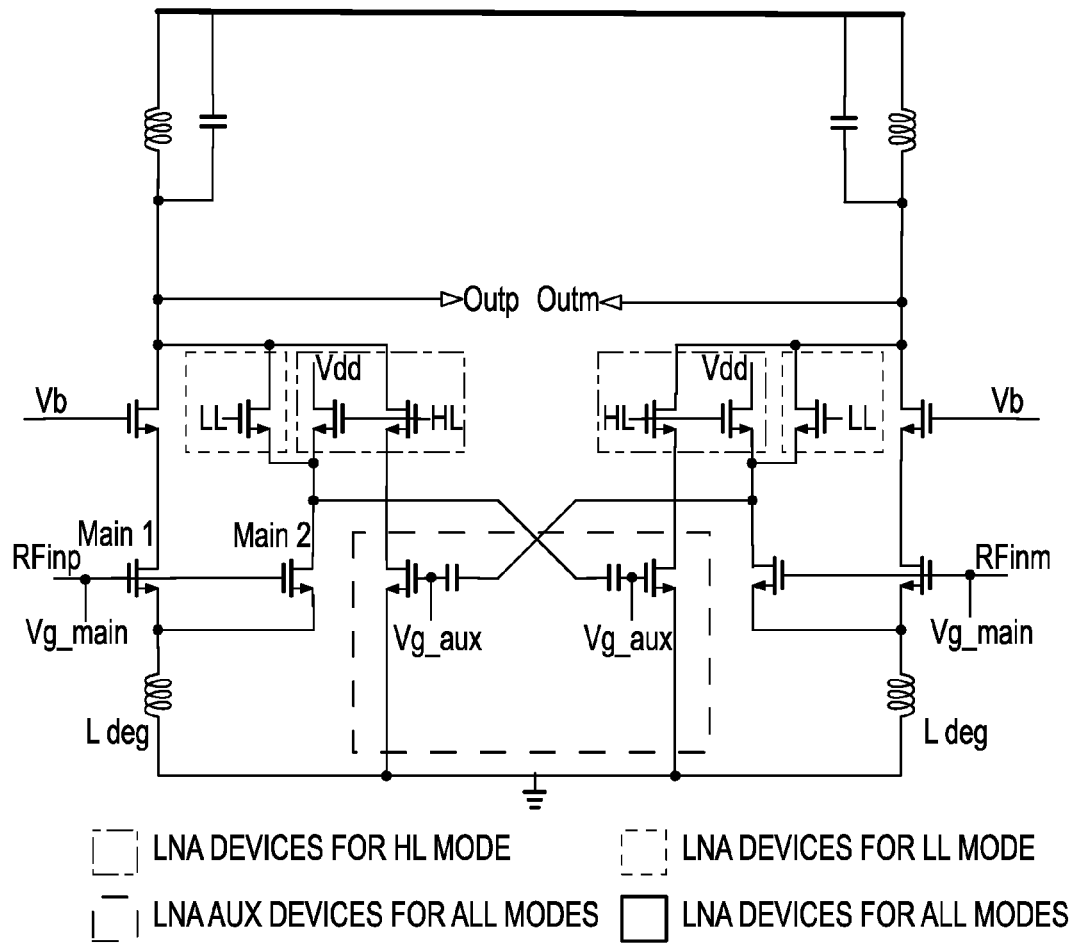

FIGS. 8a and 8b illustrate a fourth set of examples of differential architectural variant of the dual LNA architecture shown in FIG. 4. The input of the $-g3$ generator (auxiliary path) is tied to the output of the LNA 420 (drain of Main2 device) in either its own half plane (as shown in FIG. 8a) or the other half plane (as shown in FIG. 8b). The degeneration inductor can be either adopted or omitted in the auxiliary path depending on the performance requirement. The output of the auxiliary path is combined with the output of the LNA 410 after the cascode portion of the amplifier.

Although the dual LNA architectures shown in FIGS. 5a-8b are illustrated as differential amplifiers, each design may be converted to single-ended amplifiers through techniques well known to one skilled in the art. Additionally, one skilled in the art would understand that other examples of differential or single-ended architectural variants of the dual LNA architecture may be used without affecting the scope and spirit of the present disclosure. Also, one skilled in the art would appreciate that LNA architectures illustrated in FIGS. 4-8b can be used for many applications, including but not limited to, wireless communication systems, navigation receivers such as GPS receivers, high data rate receivers, etc.

Figure 9:
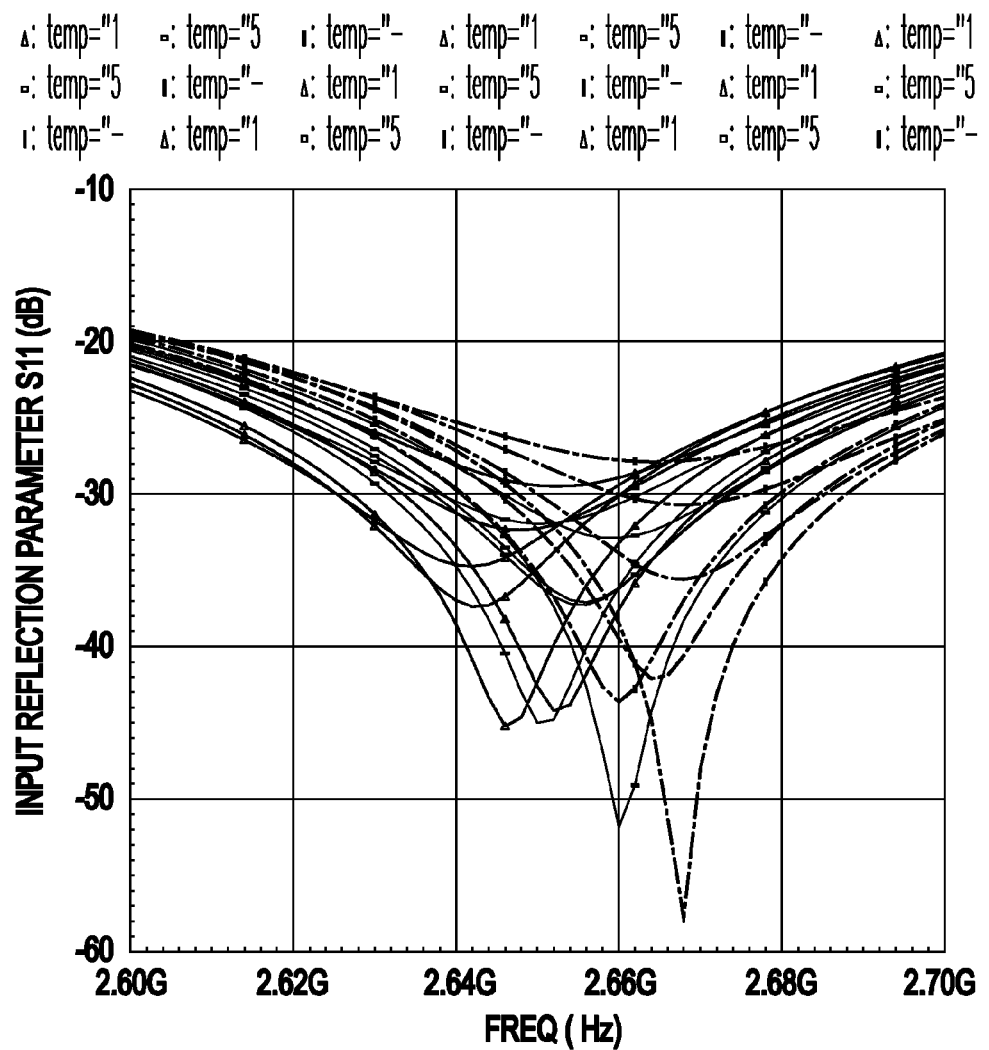

FIG. 9 illustrates example input matching performance data for the dual LNA architecture illustrated in FIG. 7a. The horizontal axis shows the RF frequency from 2.6 GHz to 2.7 GHz. The vertical axis shows the input reflection parameter S11 in decibels (dB). S11 performance is for a) three temperatures −30 C, 55 C, and 110 C; b) three process corners—typical (TT), fast corner (FF) and slow corner (SS); and c) for HL and LL modes. S11 is very stable over frequency as expected.

Those of skill would further appreciate that the various illustrative components, logical blocks, modules, circuits, and/or algorithm steps described in connection with the examples disclosed herein may be implemented as electronic hardware, firmware, computer software, or combinations thereof. To clearly illustrate this interchangeability of hardware, firmware and software, various illustrative components, blocks, modules, circuits, and/or algorithm steps have been described above generally in terms of their functionality. Whether such functionality is implemented as hardware, firmware or software depends upon the particular application and design constraints imposed on the overall system. Skilled artisans may implement the described functionality in varying ways for each particular application, but such implementation decisions should not be interpreted as causing a departure from the scope or spirit of the present disclosure.

For example, for a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described therein, or a combination thereof. With software, the implementation may be through modules (e.g., procedures, functions, etc.) that performs the functions described therein. The software codes may be stored in memory units and executed by a processor unit. Additionally, the various illustrative flow diagrams, logical blocks, modules and/or algorithm steps described herein may also be coded as computer-readable instructions carried on any computer-readable medium known in the art or implemented in any computer program product known in the art.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure.

The invention claimed is:

1. An amplifier for operating at low, middle or high linearity modes, the amplifier comprising:
   a first low noise amplifier (LNA) coupled to a second low noise amplifier for providing amplification;
   a first degeneration inductor coupled to the first LNA for providing impedance matching;
   a $-g_3$ generation block coupled to an output of the second LNA for canceling third-order transconductance distortion;
   a first enabling/disabling component coupled to the output of the second LNA and aligned in parallel with the $-g_3$ generation block for operating at least one of the first and second LNAs at one of the low, middle or high linearity modes; and
   a second enabling/disabling component aligned in parallel to the first enabling/disabling component while coupled to the second LNA at a first end and to a ground at a second end.

2. The amplifier of claim 1 wherein the first enabling/disabling component is enabled to operate the first and second LNAs in the low linearity mode.

3. The amplifier of claim 1 wherein the first enabling/disabling component is disabled and the second enabling/disabling component is enabled to operate the first and second LNAs in the high linearity mode.

4. The amplifier of claim 1 wherein the $-g_3$ generation block uses either a Modified Distortion Superposition (MDS) technique or a Post Linearization technique for canceling third-order transconductance distortion.

5. The amplifier of claim 1 wherein the first degeneration inductor is also coupled to the second LNA to be shared between the first LNA and the second LNA.

6. The amplifier of claim 1 wherein the first enabling/disabling component is enabled to operate the first and second LNAs in the low linearity mode.

7. The amplifier of claim 1 wherein the first LNA includes a first enable line for enabling/disabling the first LNA, and the second LNA includes a second enable line for enabling/disabling the second LNA.

8. The amplifier of claim 1 wherein the first LNA includes a first enable line for enabling/disabling the first LNA, and the second LNA includes a second enable line for enabling/disabling the second LNA.

9. The amplifier of claim 8 wherein the $-g_3$ generation block includes a third enable line for enabling the $-g_3$ generation block to cancel third-order transconductance distortion.

10. The amplifier of claim 9 further comprising a processor for controlling the first LNA, the second LNA and the $-g_3$ generation block by configuring one or more of the first enable line, second enable line, third enable line, first enabling/disabling component and second enabling/disabling component.

11. The amplifier of claim 10 wherein the processor configures the first, second and third enable lines to an enable state, configures the first enabling/disabling component to an enable state and configures the second enabling/disabling component to a disable state to operate the amplifier in the middle linearity mode.

12. The amplifier of claim 1 wherein the $-g_3$ generation block includes an enable line for enabling the $-g_3$ generation block to cancel third-order transconductance distortion.

13. The amplifier of claim 12 further comprising an RF input port coupled to a first LNA input and a second LNA input for receiving an input signal.

14. The amplifier of claim 13 wherein either a) the first enabling/disabling component is enabled to operate the first and second LNAs in the low linearity mode or b) the first enabling/disabling component is disabled and the second enabling/disabling component is enabled to operate the first and second LNAs in the high linearity mode.

15. The amplifier of claim 14 wherein one of the first or second enabling/disabling component is a switch controlled by a processor for opening or closing the switch.

16. The amplifier of claim 13 further comprising a second degeneration inductor coupled to the second LNA for providing impedance matching for the second LNA.

17. An amplifier for operating at low linearity, middle linearity or high linearity modes, the amplifier comprising:
- an RF input port;
- a first low noise amplifier (LNA) and a second LNA both coupled to the RF input port for providing amplification;
- a first degeneration inductor coupled to the first LNA and the second LNA for providing impedance matching;
- a $-g_3$ generation block coupled to an output of the second LNA for canceling third-order transconductance distortion;
- a first switch coupled to the output of the second LNA and aligned in parallel with the $-g_3$ generation block; and
- a second switch aligned in parallel with the $-g_3$ generation block while coupled to the second LNA at a first end and to a ground at a second end and wherein either a) the first switch is closed to operate the first and second LNAs in the low linearity mode or b) the first switch is open and the second switch is closed to operate the first and second LNAs in the high linearity mode.

18. An apparatus for operating at low linearity, middle linearity or high linearity modes, the apparatus comprising:
- an RF input means;
- a first amplifying means and a second amplifying means both coupled to the RF input means for providing amplification;
- a first degeneration means coupled to the first amplifying means and the second amplifying means for providing impedance matching;
- a $-g_3$ generation means coupled to an output of the second amplifying means for canceling third-order transconductance distortion;
- a first switching means coupled to the output of the second amplifying means and aligned in parallel with the $-g_3$ generation means; and
- a second switching means aligned in parallel with the $-g_3$ generation means while coupled to the second amplifying means at a first end and to a ground at a second end and wherein either a) the first switching means is closed to operate the first and second amplifying means in the low linearity mode or b) the first switching means is open and the second switching means is closed to operate the first and second amplifying means in the high linearity mode.

* * * * *